(12) United States Patent
Tseng

(10) Patent No.: US 6,407,564 B1
(45) Date of Patent: Jun. 18, 2002

(54) UNIVERSAL BGA BOARD FOR FAILURE ANALYSIS AND METHOD OF USING

(75) Inventor: Fouriers Tseng, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/368,199

(22) Filed: Aug. 4, 1999

(51) Int. Cl.⁷ .................................................. G01R 3/02
(52) U.S. Cl. ........................................ 324/755; 324/765
(58) Field of Search ................................. 324/754, 755, 324/765; 439/66–70; 361/760, 777, 719; 174/52.2

(56) References Cited

U.S. PATENT DOCUMENTS

| | | | | |
|---|---|---|---|---|
| 5,825,171 A | * | 10/1998 | Shin ............................ | 324/73.1 |
| 5,864,470 A | * | 1/1999 | Shim et al. ................. | 361/777 |
| 5,923,540 A | * | 7/1999 | Asada et al. ................ | 174/35 |
| 5,981,873 A | * | 11/1999 | Heo ........................... | 174/52.2 |

* cited by examiner

Primary Examiner—Vinh P. Nguyen
(74) Attorney, Agent, or Firm—Tung & Associates

(57) ABSTRACT

An universal ball grid array (BGA) test board for performing a failure analysis on any size IC chips and a method for performing such analysis are disclosed. In the universal BGA test board, an electrically insulating material is used as a substrate with a rectangular opening provided at a center. A plurality of spaced-apart conductive lines are provided surrounding and adjacent to the center opening for use as ground and power supply respectively. A multiplicity of conductive leads, a multiplicity of ball pads are then provided on the surface of the substrate with a multiplicity of conductive traces connecting thereinbetween such that one conductive lead is connected to one ball pad. The test method can be easily conducted by first wire bonding the conductive leads to the bond pads on the IC chip and then contacting the ball pads with probe needles for feeding in test signals into the IC chip. Defects are shown as hot spots in a liquid crystal material that is coated on the top surface of the IC chip.

8 Claims, 3 Drawing Sheets

UNIVERSAL BGA BOARD FOR FAILURE ANALYSIS AND METHOD OF USING

FIELD OF THE INVENTION

The present invention generally relates to a ball grid array (BGA) test board for use in failure analysis of IC chips and a method of using the board and more particularly, relates to an universal BGA test board that can be used on both the top and bottom sides of the board for testing for any size IC chips and a method of using such universal BGA test board.

BACKGROUND OF THE INVENTION

In the semiconductor fabrication technology, the capability and effectiveness of performing a failure analysis on a semiconductor chip package are very important. When an integrated circuit (IC) chip fails in service, the nature and the cause for such failure must be determined in order to prevent the reoccurrence of such failure in similar products.

An IC chip is normally built on a silicon base substrate with many layers of insulating materials and metal interconnections. This type of multi-layer structure becomes more important in modem IC devices such as high density memory chips where, in order to save chip real estate, the active device is built upwards in many layers forming transistors, capacitors and other logic components.

When an IC device is found defective during a quality control test, various failure analysis techniques can be used to determine the cause of such failure. Two of the more recently developed techniques for performing failure analysis are the infrared light emission microscopy and the light-induced voltage alteration (LIVA) imaging technique. In the infrared light emission light analysis, an infrared light transmitted through a substrate silicon material is used to observe from the backside of an IC the failure mode of the circuit. For instance, at a magnification ratio of 100×, a failure point in the circuitry can be located. The LIVA imaging technique can be used to locate open-circuited and damaged junctions and to image transistor logic states. The LIVA images are produced by monitoring the voltage fluctuation of a constant current power supply when a laser beam is scanned over an IC. A high selectivity for locating defects is possible with the LIVA technique.

Another method that has become more common in failure analysis of IC chips is the scanning optical microscopy (SOM). The high focusing capability of SOM provides improved image resolution and depth comparable to conventional optical microscopy. It is a useful tool based on the laser beam's interaction with the IC. The SOM technique enables the localization of photocurrents to produce optical beam induced current image that show junction regions and transistor logic states. Several major benefits are made possible by the SOM method when compared to a conventional scanning electron microscopy analysis. For instance, the benefits include the relative ease of making IC electrical connection, the no longer required vacuum system and the absence of ionizing radiation effects.

Even though the above discussed techniques are effective in identifying failure modes in IC circuits, the techniques require elaborate and complicated electronic equipment which are generally costly and not readily available in a semiconductor fabrication facility. It is therefore desirable to have available a method and apparatus that can be easily carried out without expensive laboratory equipment such that the apparatus can be installed in any fabrication facilities. One such apparatus utilizes a liquid crystal coating layer for the identification of failure sites in an IC chip. For instance, in the method wherein a liquid crystal layer is used for the identification of failure sites, a liquid crystal material is frequently coated on top of an IC chip or an IC package. A typical test set up is shown in FIG. 1.

As shown in FIG. 1, a typical liquid crystal detection apparatus 10 is provided. The apparatus 10 generally includes a heater 12 and an optical microscope 14. On a top surface 16 of the heater 12, an IC package 20 is positioned under the microscope 14. The IC package 20 may be a plastic quad flat pack (PQFP) or any other packaged IC device. The IC package 20, shown in FIG. 1, is completed with bonding pads 22 and bonding wires 24. In the middle portion of the package 20 are IC circuits that contain failure sites need to be identified by a liquid crystal method. In the conventional method, a liquid crystal material is first coated to the top surface 26 of the IC package 20. The IC package 20 is then positioned on top of the heater 12 which can be heated at a pre-programmed heating rate to a specific temperature. The IC package 20, together with the coated liquid crystal layer (not shown) is normally heated to a temperature just below the clear/opaque transition temperature of the liquid crystal material. For instance, a suitable temperature would be approximately between about 5° and about 10° below the transition temperature of the liquid crystal. After the IC package 20 is heated to the predetermined temperature, a pre-selected voltage is applied to the IC circuit through bonding wires 24. The IC circuit, upon receiving such a voltage, heats up at any short or leakage positions. A hot spot is thus generated at each of the locations. The liquid crystal material immediately adjacent, or contacting the hot spots has its temperature raised above its transition temperature and transforms from an opaque state to a clear state. As a result, bright spots in the liquid crystal layer, i.e., on the IC package, show up to indicate the failure sites in the package.

Several drawbacks have been noted in the practice of the liquid crystal detection method. One of the obvious drawbacks is that when testing IC chips of different sizes, a single test board cannot be used for all IC chips. A different test board is required for testing chips of different sizes such that the chip can be mounted on the board for making electrical connections by wire bonding with the conductive leads provided on the test board. Based on the large number of IC chips of different sizes it is a tedious task to supply a large number of test boards that will fit each individual chip. Ideally, a universal test board should be designed such that it will fit different sizes of IC chips for testing.

It is therefore an object of the present invention to provide an universal test board for performing failure analysis on IC chips that does not have the drawbacks or shortcomings of the conventional test boards.

It is another object of the present invention to provide an universal test board for failure analysis that is constructed in a ball grid array configuration such that probe needles can be used to make electrical contact with the ball pads in the ball grid array.

It is a further object of the present invention to provide an universal BGA board for performing failure analysis that fits any size of IC chips.

It is another further object of the present invention to provide an universal BGA test board for performing failure analysis fits IC chips that have a dimension between about 0.1 cm×0.1 cm and about 1.8 cm×1.8 cm.

It is still another object of the present invention to provide an universal BGA test board for performing failure analysis which is equipped with a multiplicity of elongated conductive leads surrounding a rectangular opening in the board such that elongated leads can be severed and shortened by enlarging the rectangular opening to fit a large IC chip.

It is yet another object of the present invention to provide an universal BGA test board for performing failure analysis which has a top side and a bottom side both equipped with a multiplicity of conductive leads, ball pads and conductive traces connecting thereinbetween such that a small chip can be tested on one side and a large chip can be tested on the opposite side of the test board.

It is still another further object of the present invention to provide a method for failure analysis by using an universal BGA test board wherein the test board can be connected electrically to an IC chip on both sides of the board and to fit IC chips of various dimensions.

It is yet another further object of the present invention to provide an universal BGA test board for conducting failure analysis on IC chips in which one side of the test board can be used for testing IC chips that have dimensions between about 0.1 cm×0.1 cm and about 0.8 cm×0.8 cm, while the opposite side of the test board can be used for testing IC chips that have dimensions between about 0.1 cm×0.1 cm and about 1.8 cm×1.8 cm.

SUMMARY OF THE INVENTION

In accordance with the present invention, an universal ball grid array test board for performing failure analysis and a method for using such test board are provided.

In a preferred embodiment, an universal ball grid array (BGA) test board for failure analysis can be provided which includes a board member fabricated of an electrically insulating material, a rectangular opening at the center of the board member, at least two spaced-apart conductive lines on the board member surrounding and juxtaposed to the opening with at least one for ground and at least one for power respectively, a first multiplicity of conducive leads on the board. member positioned spaced-apart and surrounding the at least two conductive lines, a first multiplicity of ball pads arranged in a plurality of rows along an outer periphery of the board member, and a first multiplicity of conductive traces connecting between the first multiplicity of conductive leads and the first multiplicity of ball pads such that only one conductive lead is connected to one ball pad.

In the universal BGA test board for failure analysis, the first multiplicity of conductive leads may be formed in an elongated shape that is perpendicular to the sides of the rectangular opening such that they may be severed and shortened when the rectangular opening is enlarged to accommodate an IC chip of larger size. The plurality of rows of the ball pads may include at least two rows arranged parallel to the sides of the rectangular opening. The board member has a top side and a bottom side with the at least two conductive lines, the first multiplicity of conductive pads, the first multiplicity of ball pads and the first multiplicity of conductive traces formed on both the top and bottom sides.

In the universal BOA test board for failure analysis, the rectangular opening may be an opening that has four sides of equal length. The at least two spaced-apart conductive lines may be four lines with two for ground and two for power. The first multiplicity of ball pads may be arranged in a ball grid array pattern. The first multiplicity of conductive traces may be insulated and covered by a protective coating. The rectangular opening may have a size between about 0.1 cm×0.1 cm and about 1.8 cm×1.8 cm.

The present invention is further directed to a method for failure analysis by using an universal ball grid array test board which includes the steps of first providing a board member that is fabricated of an electrically insulating material, a rectangular opening at a center of the board member, at least two spaced-apart conductive lines on the board member surrounding and juxtaposed to the opening with at least one for ground and at least one for power respectively, a first multiplicity of conductive leads on the board member positioned spaced-apart and surrounding the at least two conductive lines, a first multiplicity of ball pads arranged in a plurality of rows along an outer periphery of the board member, and a first multiplicity of conductive traces connecting between the first multiplicity of conductive leads and the first multiplicity of ball pads such that only one conductive lead is connected to one ball pad, then positioning an IC chip which has a second multiplicity of bond pads on a surface in the rectangular opening, wire bonding the first multiplicity of conductive leads to the second multiplicity of bond pads, coating a layer of liquid crystal material over an active area on the top surface of the IC chip, and contacting the first multiplicity of ball pads with a third multiplicity of probe needles and conducting a failure analysis.

The method for conducting failure analysis by using an universal BGA test board may further include the step of providing the first multiplicity of conductive leads in elongated shape perpendicular to the sides of the rectangular opening. The method may further include the step of severing and shortening the multiplicity of conductive leads by enlarging the rectangular opening to accommodate an IC chip of larger size. The method may further include the step of drying the liquid crystal material after coating on the active area on the top surface of the IC chip, feeding test signals into the IC chip through the third multiplicity of probe needles, and observing hot spots in the active area of the IC chip after test signals are fed into the chip through the third multiplicity of probe needles. The method may further include the step of providing a substantially transparent plate in the rectangular opening for mounting the IC chip to be tested thereto.

In an alternate embodiment, an universal BGA test board for performing failure analysis of an IC chip can be provided which includes a board member made of an electrically insulating material that has a top side and a bottom side, a rectangular opening of less than 1.5 cm×1.5 cm formed at a center of the board member, at least two spaced-apart conductive lines on the top side of the board member positioned immediately adjacent to the opening, a first multiplicity of conductive leads, ball pads and conductive traces connecting thereinbetween on the top side of the board member positioned juxtaposed to the at least two conductive lines, at least two spaced-apart conductive lines on the bottom side of the board member positioned at a substantial distance to the opening, and a second multiplicity of conductive leads, ball pads and conductive traces connecting thereinbetween on the bottom side of the board member positioned juxtaposed to the at least two conductive lines.

In the universal BGA test board for conducting failure analysis on IC chips, the first multiplicity of conductive leads may be formed in elongated shape perpendicular to the sides of the rectangular opening such that they may be severed and shortened when the rectangular opening is enlarged to accommodate an IC chip of larger size. The substantial distance between the at least two spaced-apart conductive lines on the bottom side of the board member and the rectangular opening may be at least 0.5 cm. The rectangular opening is not less than 0.8 cm×0.8 cm. The top side of the board member accommodates an IC chip having a size between about 0.1 cm×0.1 cm and about 0.8 cm×0.8 cm for testing, and the bottom side of the board member accommodates an IC chip having a size between about 0.1 cm×0.1 cm and about 1.8 cm×1.8 cm for testing.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1:
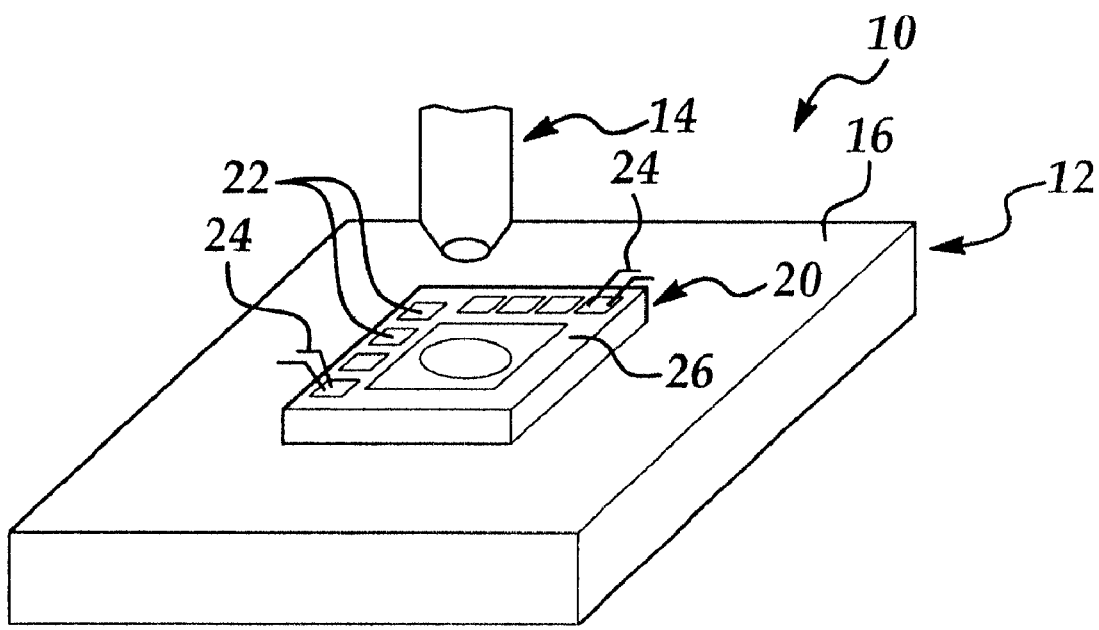
FIG. 1 is an illustration of a conventional test set-up for failure analysis of an IC chip that is connected to a test circuit by bonding wires.

The present invention discloses an universal ball grid array (BGA) test board for performing failure analysis on IC chips and a method for using such test boards.

In a preferred embodiment, both the top side and the bottom side of the test board are provided with conductive lines for ground and power, a multiplicity of conductive leads, a multiplicity of bond pads and a multiplicity of conductive traces connecting the conductive leads and the ball pads. In the preferred embodiment, the test board is designed such that both the top side and the bottom side are used for testing IC chips of the same dimension and furthermore, both the top side and the bottom side can be used to test either one or two chips simultaneously resulting in cost savings and reduced test time.

In an alternate embodiment, an universal BGA test board for performing failure analysis is provided which has a top side provided with a pattern of conductive leads, ball pads and conductive traces designed for testing a smaller IC chip, while the bottom side is provided with a second multiplicity of conductive leads, ball pads and conductive traces designed for testing a larger IC chip.

In still another alternate embodiment, both the top side and the bottom side of the BGA test board may be designed for testing a smaller IC chip. However, the center opening of the test board may be cut to fit a larger chip size. This is made possible by using conductive leads that are provided in elongated shape such that they may be severed and shortened when the center rectangular opening is cut for accommodating a larger IC chip. The connection of the conductive leads to the ball pads by the conductive traces are not otherwise disturbed when the conductive leads are severed to a shortened length. For instance, the top side of the BGA test board may be designed to test IC chips that have dimensions between about 0.1 cm×0.1 cm and about 0.8 cm×0.8 cm, while the bottom side of the BGA test board may be designed for holding an IC chip that has a dimension between about 0.1 cm×0.1 cm and about 1.8 cm×1.8 cm.

The present invention further provides a method for performing failure analysis by using an unique BGA test board that is supplied as previously described, an IC chip that has a multiplicity of bond pads formed on a top surface is then positioned in the rectangular opening of the test board, the multiplicity of conductive leads on the test board is then wire bonded to the second multiplicity of bond pads, a layer of liquid crystal material is then coated and dried over an active area on the top surface of the IC chip, and the multiplicity of ball pads is then contacted by a multiplicity of probe needles for conducting a failure analysis. During the failure analysis, test signals are fed into the IC chip such that hot spots are generated at defects on the chip. The defect in the circuit generates heat such that the layer of liquid crystal material coated on top is raised above its transition temperature for showing the location of the defect.

Figure 2A:
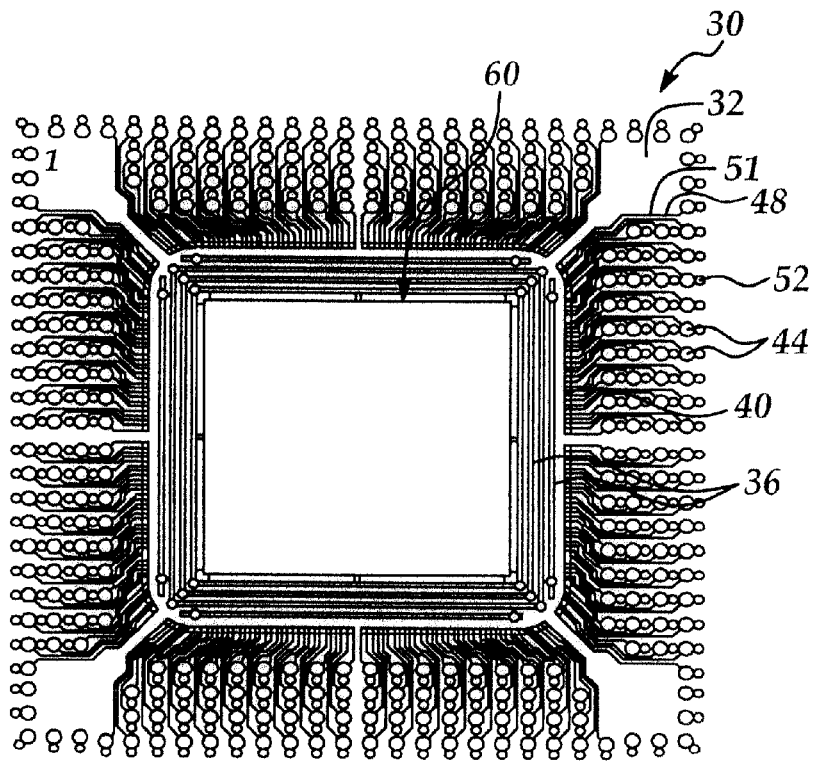
FIG. 2A is a plane view of the present invention preferred embodiment BGA test board showing the front side of the board.
Figure 2B:
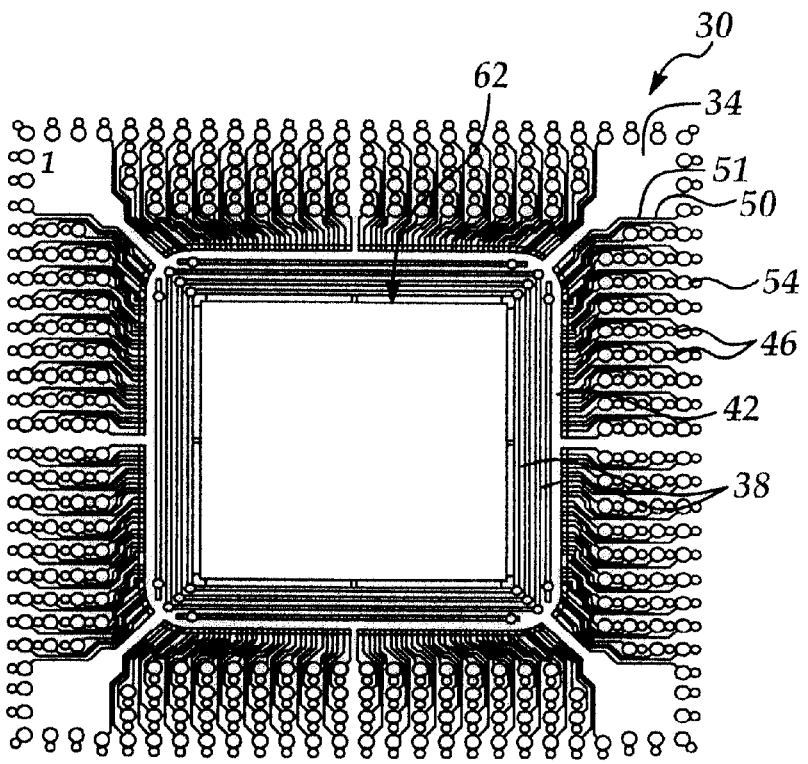
FIG. 2B is an enlarged, plane view of the back side of the present invention preferred embodiment test board shown in FIG. 2A.

FIGS. 2A and 2B illustrate a preferred embodiment of the present invention universal BGA test board for performing failure analysis on IC chips. As shown in the Figures, the front side and the back side of the present invention preferred embodiment test board are exactly the same. For instance, in the test board 30, the front side 32 and the back side 34 have the same number of conductive lines 36, 38, the same number of conductive leads 40, 42, the same number of ball pads 44, 46, and the same number of conductive traces 48, 50 for connecting between the ball pads and the conductive leads, The conductive lines 36, 38 are usually provided such that there is at least one line for ground and at least one line for power. As shown in FIGS. 2A and 2B, a total of two conductive lines are used for ground and a total of two conductive lines are used for power supply.

The conductive traces 48, 50 enable connections to be made between the ball pads and the conductive leads. The conductive traces 48, 50 after formed are usually coated and insulated by a protective coating layer 51. The ball pads 44, 46 are formed on vias 52, 54 such that the ball pads on the front side and on the back side are connected through the via plugs formed in the vias 52, 54.

As shown in FIGS. 2A and 2B, the plurality of conductive lines 36, 38 are normally formed surrounding the rectangular shaped openings, or the square shaped openings 60, 62 such that they can be easily connected to the IC chip positioned in the opening. During a failure analysis test, the shape of the opening is first determined by the size of the IC chip, for instance, as shown in FIGS. 2A and 2B, the openings 60, 62 are specifically designed for an IC chip that has the same size as the opening. To facilitate the mounting of the IC chip in the openings 60, 62, a clear or substantially transparent panel of either glass or plastic is first mounted to the opening by adhesive means. The IC chip is then mounted by adhesives, such as a double-sided adhesive tape to the substantially transparent panel. Wire bonding process is then conducted to connect bond pads formed on a top surface of the IC chip to the conductive leads 40, 42.

As shown in FIGS. 2A and 2B, a total of 288 ball pads are provided which are connected to 288 conductive leads 40, 42 for connecting to the IC chip (not shown). Since silicon material is transparent and the glass plate is also transparent, the defects formed on the surface of the IC chip can be visually examined. The present invention affords an easy test method for performing failure analysis on IC chips before the chips are passivated. No polishing or grinding of the chip surface is required for the observation. After a liquid crystal material is coated and dried on the top surface of the IC chip, bright spots or hot spot are evident after probe needles contact the ball pads 52, 54 and feed a test signal into the IC chip. By utilizing the present invention novel BGA test board, both sides of the IC chip can be simultaneously tested and visually examined to determine the location of the defects.

The present invention novel BGA test board may be reused after testing of an IC chip. The wire bonds are normally formed in aluminum and therefore can be easily washed off for further use. In a frequently used BGA test board, the pitch between the conductive leads 40, 42 is approximately 6 mil, or approximately 150 Å. At such distance, the conductive leads can be easily formed and wire bonded to the bond pads on the IC chip tested. The ball pads 52, 54 are sufficiently large such that contacts with probe needles can be easily established.

The BGA test board shown in FIGS. 2A and 2B can be used for testing IC chips that are as large as 1.8 cm×1.8 cm. Smaller chips may be adhesively mounted on the clear glass panel and then connected to the conductive leads 40, 42 by longer bond wires (not shown). However, for smaller chips, i.e., chips that are substantially smaller than 1.8 cm×1.8 cm, the present invention alternate embodiment shown in FIGS. 3A and 3B may be more advantageously utilized.

Figure 3A:
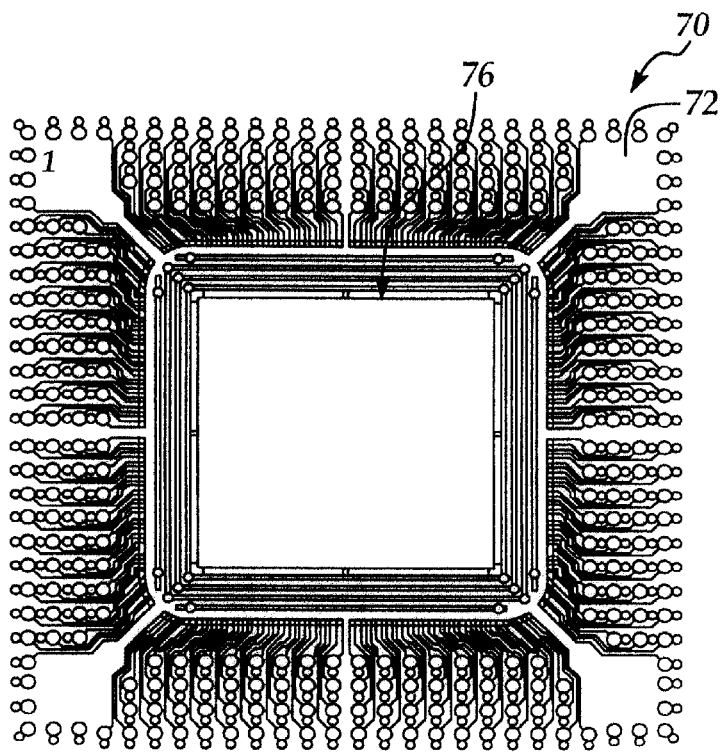
FIG. 3A is an enlarged, plane view of the present invention alternate embodiment BGA test board showing the front side.
Figure 3B:
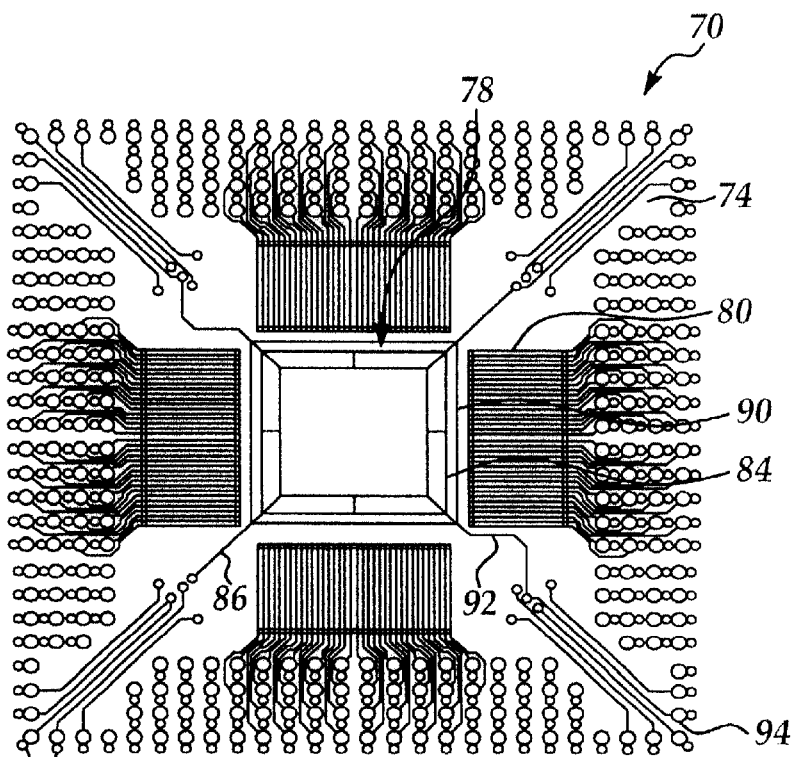
FIG. 3B is an enlarged, plane view of the back side of the present invention alternate embodiment BGA test board of FIG. 3A.

As shown in FIGS. 3A and 3B, a present invention universal BGA test board 70 is shown in a front view (FIG. 3A) and in a back view (FIG. 3B). The front side 72 is provided with a larger opening 76 while the back side 74 is provided with a smaller opening 78. This is possible by having a large inactive edge area shown in the front side 76 which provides the support of the backside 74. The front side 72 of the BGA test board 70 can be used in a way similar to that previously described in the preferred embodiment of the present invention shown in FIGS. 2A and 2B. The opening 76 can be suitably used for IC chips as large as 1.8 cm×1.8 cm. However, substantially smaller chips, i.e., in the range of between about 0.1 cm×0.1 cm and about 0.8 cm×0.8 cm can be tested on the bottom side 74 of the BGA test board 70.

It is seen in FIG. 3B, the conductive leads 80 are formed in elongated shape such that they may be severed or shortened when a special sized opening at the center of the board 70 must be cut to fit a specific IC chip. In the configuration shown in FIG. 3B, only 152 ball pads, and consequently only 152 conductive leads are provided for testing a smaller chip. The power line 84 are fed by the conductive line 86 through ball pad 88. The ground line 90 is fed by conductive line 92 through ball pad 94. When the center opening is enlarged by removing additional areas in the test board 70, the ground and power connections may be made to the conductive lines 86 and 92 directly. The present invention novel feature of an adjustable or universal BGA test board for testing any size IC chip is therefore evident in FIG. 3B. By providing novel conductive leads 80 which may be severed and shortened, any size IC chip between about 0.1 cm×0.1 cm and about 1.8 cm×1.8 cm may be tested in the board configuration shown in FIGS. 3A and 3B. The present invention novel apparatus of an universal BGA test board therefore enables the use of a single test board for testing IC chips of a variety of different dimensions.

The present invention novel apparatus and a method for using such apparatus have been amply described in the above descriptions and in the appended drawings of FIGS. 2A~3B. The present invention novel BGA test board can be advantageously used in E-beam tester by utilizing liquid crystal. The center opening can be modified easily such that it can be used in both a front side or a back side analysis such as EMMI, OBIC, IR-OBIC or IR-EMMI.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the invention.

The embodiment of the invention in which an exclusive property or privilege is claimed are defined as follows:

1. A universal ball grid array (BGA) board for failure analysis comprising:

a board member fabricated of an electrically insulating material, a rectangular opening at a center of said board member, at least two spaced-apart conductive lines on said board member, surrounding and juxtaposed to said opening with at least one for ground and at least one for power respectively, a first multiplicity of conductive leads on said board member positioned spaced-apart and surrounding said at least two conductive lines, said first multiplicity of conductive leads are formed in elongated shape perpendicular to the sides of said rectangular opening such that they may be severed and shortened when said rectangular opening is enlarged to accommodate an IC chip of larger size, a first multiplicity of ball pads arranged in a plurality of rows along an outer periphery of said board member, and a first multiplicity of conductive traces connecting between said first multiplicity of conductive leads and said first multiplicity of ball pads such that only one conductive lead is connected to one ball pad.

2. An universal ball grid array (BGA) board for failure analysis according to claim 1, wherein said plurality of rows of said ball pads comprises at least two rows arranged parallel to the sides of the rectangular opening.

3. An universal ball grid array (BGA) board for failure analysis according to claim 1, wherein said board member has a top side and a bottom side with said at least two conductive lines, said first multiplicity of conductive leads, said first multiplicity of ball pads and said first multiplicity of conductive traces formed on both said top and bottom sides.

4. An universal ball grid array (BGA) board for failure analysis according to claim 1, wherein said rectangular opening is an opening with four sides of equal length.

5. An universal ball grid array (BGA) board for failure analysis according to claim 1, wherein said at least two spaced-apart conductive lines are four lines with two for ground and two for power.

6. An universal ball grid array (BGA) board for failure analysis according to claim 1, wherein said first multiplicity of ball pads is arranged in a ball grid array pattern.

7. An universal ball grid array (BGA) board for failure analysis according to claim 1, wherein said first multiplicity of conductive traces is insulated and covered by a protective coating.

8. An universal ball grid array (BGA) board for failure analysis according to claim 1, wherein said rectangular opening has a size between about 0.1 cm×0.1 cm and about 1.8 cm×1.8 cm.

* * * * *